(12) United States Patent
Kim et al.

(10) Patent No.: US 12,261,072 B2
(45) Date of Patent: Mar. 25, 2025

(54) SUBSTRATE TEST APPARATUS AND METHOD FOR MEASURING DECHUCKING FORCE USING THE SAME

(71) Applicant: SEMES CO., LTD., Chungcheongnam-do (KR)

(72) Inventors: Jong Ho Kim, Gyeonggi-do (KR); Doo Hee Lee, Daegu (KR); Hae Yong Ryu, Gyeonggi-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 405 days.

(21) Appl. No.: 17/890,987

(22) Filed: Aug. 18, 2022

(65) Prior Publication Data

US 2023/0140544 A1 May 4, 2023

(30) Foreign Application Priority Data

Oct. 28, 2021 (KR) .......................... 10-2021-0145982

(51) Int. Cl.
*H01L 21/683* (2006.01)
*H01J 37/32* (2006.01)
*H01L 21/687* (2006.01)

(52) U.S. Cl.
CPC .... *H01L 21/6833* (2013.01); *H01J 37/32715* (2013.01); *H01J 37/32935* (2013.01); *H01L 21/68721* (2013.01); *H01J 2237/0048* (2013.01)

(58) Field of Classification Search
CPC ........... H01L 21/6833; H01L 21/68721; H01L 21/67253; H01L 21/67259; H01L 21/6831;

(Continued)

(56) References Cited

U.S. PATENT DOCUMENTS 5,117,121 A 5/1992 Watanabe et al.
5,684,669 A * 11/1997 Collins .................. H02N 13/00
361/234

(Continued)

FOREIGN PATENT DOCUMENTS

JP 10-247675 9/1998
JP 2004319840 A * 11/2004

(Continued)

OTHER PUBLICATIONS

Office Action dated Nov. 7, 2023 for Japanese Patent Application No. 2022-146787 and its English translation from Global Dossier.

(Continued)

*Primary Examiner* — Dharti H Patel
(74) *Attorney, Agent, or Firm* — WOMBLE BOND DICKINSON (US) LLP (57) ABSTRACT

A substrate test apparatus is provided that can measure a dechucking force with high reliability. The substrate test apparatus includes an electrostatic chuck, a normal-force measuring unit disposed on the electrostatic chuck to be capable of pushing or pulling the substrate vertically, an electrostatic-chuck power supplying unit for applying a driving voltage and a first ground voltage to the electrostatic chuck, and a substrate power supplying unit for applying a second ground voltage to the substrate, wherein the substrate test apparatus performs steps including applying the driving voltage to the electrostatic chuck and charging the substrate by applying the second ground voltage to the substrate, subsequently discharging the substrate by applying the first ground voltage to the electrostatic chuck and by applying the second ground voltage to the substrate, and subsequently measuring a dechucking force of the substrate by pulling the substrate vertically by the normal-force measuring unit.

20 Claims, 7 Drawing Sheets

(58) Field of Classification Search
CPC ........... H01J 37/32715; H01J 37/32935; H01J 2237/0048; B23Q 3/15; H02N 13/00
USPC ........................................................ 361/234
See application file for complete search history.

(56) References Cited

U.S. PATENT DOCUMENTS

| | | | | |
|---|---|---|---|---|
| 6,033,482 | A * | 3/2000 | Parkhe | H01J 37/32009 |
| | | | | 118/728 |
| 6,236,555 | B1 * | 5/2001 | Leeser | H01L 21/6833 |
| | | | | 279/128 |
| 6,307,728 | B1 | 10/2001 | Leeser | |
| 6,376,795 | B1 * | 4/2002 | Zola | B23Q 3/154 |
| | | | | 279/128 |
| 7,292,428 | B2 * | 11/2007 | Hanawa | H01L 21/6831 |
| | | | | 361/234 |
| 7,821,767 | B2 | 10/2010 | Fujii | |
| 8,908,348 | B2 * | 12/2014 | Wang | B82Y 10/00 |
| | | | | 361/234 |
| 9,978,627 | B2 * | 5/2018 | Biber | H01L 22/26 |
| 10,332,774 | B2 * | 6/2019 | Takebayashi | H01L 21/68771 |
| 10,879,094 | B2 | 12/2020 | Nemani et al. | |
| 11,810,767 | B2 | 11/2023 | Takebayashi | |
| 2001/0046112 | A1 * | 11/2001 | Herchen | H02N 13/00 |
| | | | | 361/234 |
| 2002/0141132 | A1 * | 10/2002 | Lin | H01L 21/6831 |
| | | | | 279/128 |
| 2002/0141133 | A1 * | 10/2002 | Anderson | H01L 21/6831 |
| | | | | 279/128 |
| 2003/0165044 | A1 * | 9/2003 | Yamamoto | H01L 21/6833 |
| | | | | 361/234 |
| 2005/0225923 | A1 * | 10/2005 | Howald | H01J 37/32082 |
| | | | | 361/234 |
| 2006/0056131 | A1 * | 3/2006 | Tanimoto | G03F 7/2059 |
| | | | | 361/234 |
| 2006/0238953 | A1 * | 10/2006 | Hanawa | H01L 21/6831 |
| | | | | 361/234 |
| 2010/0110603 | A1 * | 5/2010 | LaFontaine | H01L 21/6831 |
| | | | | 361/234 |
| 2011/0013338 | A1 | 1/2011 | Fujii | |
| 2015/0049411 | A1 * | 2/2015 | Wang | B82Y 10/00 |
| | | | | 361/234 |
| 2015/0311105 | A1 * | 10/2015 | Sadjadi | H01L 21/0228 |
| | | | | 438/798 |

FOREIGN PATENT DOCUMENTS

| | | | | |
|---|---|---|---|---|
| JP | | 2005-12144 | 1/2005 | |
| JP | | 2006-351876 | 12/2006 | |
| JP | | 2008-205313 | 9/2008 | |
| JP | | 2010-272709 | 12/2010 | |
| JP | | 5226291 B2 | 7/2013 | |
| KR | 10-1993-0006102 | B1 | 7/1993 | |
| KR | 10-2001-0076392 | A | 8/2001 | |
| KR | 10-2007-0122481 | | 12/2007 | |
| KR | 10-2008-0012602 | | 2/2008 | |
| KR | 10-2008-0040801 | | 5/2008 | |
| KR | 10-2018-0070829 | | 6/2018 | |
| KR | 10-2019-0073607 | A | 6/2019 | |
| WO | | 2006/049085 | 5/2006 | |
| WO | WO-2006049085 | A1 * | 5/2006 | ......... H01L 21/6833 |
| WO | | 2020/054682 | 3/2020 | |

OTHER PUBLICATIONS

Notice of Allowance from Korean Patent Application No. 10-2021-0145982 dated Mar. 22, 2024 with English translation by Google Translate.

Office Action dated Jun. 8, 2023 for Korean Patent Application No. 10-2021-0145982 and its English machine translation provided by Google Translate.

* cited by examiner

SUBSTRATE TEST APPARATUS AND METHOD FOR MEASURING DECHUCKING FORCE USING THE SAME

CROSS-REFERENCE TO RELATED APPLICATION

This application claims priority from Korean Patent Application No. 10-2021-0145982 filed on Oct. 28, 2021, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate test apparatus and a method of measuring dechucking force using the same. More particularly, the present disclosure relates to a substrate testing apparatus for evaluating the dechucking force of an electrostatic chuck and a dechucking force measuring method using the substrate testing apparatus.

2. Description of the Related Art

The plasma processing method for treating the surface of a semiconductor wafer, a flat panel display substrate, etc. is generally classified into a capacitively coupled plasma (CCP) processing method and an inductively coupled plasma (ICP) processing method that are currently in use.

Such substrate processing using plasma refers to a process of applying a high-frequency power to a vacuum chamber, flowing the gas supplied into the chamber in a plasma state, and thereby using the established high-energy electrons or radicals to etch and remove a thin film. To successfully perform the substrate processing using the plasma, chucking and dechucking the semiconductor substrate in the chamber is required as a significant process.

Existing general methods known for holding a substrate in a process chamber for manufacturing a semiconductor device include a mechanical clamp method, a method using a vacuum chuck, etc., but recent years have seen a surge in the use of electrostatic chuck (ESC) that has superior uniformity in terms of particles and processing. However, using such an electrostatic chuck on a substrate, when in the process of separating the substrate after plasma treatment from the electrostatic chuck, that is, during the dechucking process, involves sticking or other issues due to incomplete removal of the residual electric charge on the substrate surface, resulting in a broken substrate in the reaction chamber or a misplaced substrate on a substrate-holding robot's blade during unloading of the substrate from the chamber.

Accordingly, there are methods under study for removing the residual surface charge in the substrate during dechucking, such as applying 0 V to a dechucking-voltage applying unit or grounding the same for a predetermined time.

However, those conventional methods suffer from an increased capacitance of the electrostatic chuck with the increased usage of the electrostatic chuck. The resultant increase of the amount of surface charge in the substrate leads to a considerable amount of process time consuming while leaving the surface charges incompletely removed, which is problematic.

SUMMARY

There is a need for a method of evaluating the good or bad performance of the process of separating the substrate from the electrostatic chuck, that is, the dechucking process. To this end, the prior art uses a horizontal sliding method for checking whether the substrate during dechucking was well cleared of the residual surface charge. However, such a method uses a horizontal push force to the substrate to measure the dechucking force acting in the vertical direction to the substrate, which provides a dechucking force evaluation method of insufficient reliability.

Additionally, the prior art takes a person to manually evaluate the dechucking force, resulting in a large evaluation dispersion and a lowered evaluation efficiency.

Aspects of the present disclosure provide a substrate test apparatus that can measure a dechucking force with high reliability with an additional normal-force measuring unit capable of pushing or pulling a substrate in a vertical direction.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a substrate test apparatus including an electrostatic chuck configured to support a substrate, a normal-force measuring unit disposed on the electrostatic chuck to be capable of pushing or pulling the substrate vertically, an electrostatic-chuck power supplying unit configured to apply a driving voltage and a first ground voltage to the electrostatic chuck, and a substrate power supplying unit configured to apply a second ground voltage to the substrate, wherein the substrate test apparatus is configured to perform steps including applying the driving voltage to the electrostatic chuck, and charging the substrate by applying the second ground voltage to the substrate, subsequently discharging the substrate by applying the first ground voltage to the electrostatic chuck and by applying the second ground voltage to the substrate, and subsequently measuring a dechucking force of the substrate by pulling the substrate vertically by the normal-force measuring unit.

The substrate test apparatus may perform a further step including setting, before the charging of the substrate, an initial charge of the substrate by applying the second ground voltage to the substrate.

The electrostatic-chuck power supplying unit may be responsive to the setting of the initial charge of the substrate for keeping from applying the driving voltage and the first ground voltage to the electrostatic chuck.

The charging of the substrate may proceed during the first operating time, and the discharging of the substrate may proceed during a second operating time different from the first operating time.

The substrate test apparatus may perform a further step including maintaining the substrate in a charged state, after the charging of the substrate and before the discharging of the substrate, by keeping from applying the driving voltage to the electrostatic chuck and by keeping from applying the second ground voltage to the substrate.

The charging of the substrate may proceed during a first operating time, the discharging of the substrate may proceed during a second operating time shorter than the first operating time, and the maintaining of the substrate in a charged state may proceed during a third operating time shorter than the second operating time.

The substrate test apparatus may further include a clamp disposed under the electrostatic chuck and configured to hold the electrostatic chuck in place.

The measuring of the dechucking force of the substrate by pulling the substrate in a vertical direction by the normal-force measuring unit may be performed while keeping from applying the second ground voltage to the substrate and keeping from applying the driving voltage and the first ground voltage to the electrostatic chuck.

The discharging of the substrate subsequently may leave, internally of the substrate, residual charges that generate between the substrate and the electrostatic chuck an electrostatic attraction by which the dechucking force is determined.

The substrate test apparatus may further include a test chamber including an interior space configured to process the substrate, and a transport unit disposed under the test chamber and configured to transport the test chamber.

The substrate test apparatus may further include a motor disposed on an upper surface of the test chamber and configured to provide the normal-force measuring unit with a driving force capable of pushing or pulling the substrate, the motor providing the normal-force measuring unit with the driving force through a ball screw mechanism in a direction perpendicular to the substrate.

Upon receiving the driving force from the motor, the normal-force measuring unit may be actuated to constantly pull the substrate at a first speed or a second speed that is different from the first speed.

The substrate test apparatus may further include a damper disposed between the motor and the normal-force measuring unit and configured to reduce the vibration generated when the motor provides the driving force to the normal-force measuring unit.

According to another aspect of the present disclosure, there is provided a method of measuring dechucking force of a substrate test apparatus including placing a substrate on an electrostatic chuck, charging the substrate by applying a driving voltage to the electrostatic chuck and applying a second ground voltage to the substrate, subsequently discharging the substrate by applying a first ground voltage to the electrostatic chuck and by applying the second ground voltage to the substrate, and subsequently measuring a dechucking force of the substrate by pulling the substrate in a vertical direction by a normal-force measuring unit that is disposed on the substrate.

The method may further step including, before the charging of the substrate, setting an initial charge of the substrate by applying the second ground voltage to the substrate.

In this case, wherein when setting the initial charge of the substrate, keeping from applying the driving voltage and the first ground voltage to the electrostatic chuck.

The method may further step including, after the charging of the substrate and before the discharging of the substrate, maintaining the substrate in a charged state by keeping from applying the driving voltage to the electrostatic chuck and by keeping from applying the second ground voltage to the substrate.

In the above-mentioned method, wherein the measuring of the dechucking force of the substrate by pulling the substrate in a vertical direction by the normal-force measuring unit is performed by keeping from applying the second ground voltage to the substrate and by keeping from applying the driving voltage and the first ground voltage to the electrostatic chuck.

In the above-mentioned method, wherein the discharging of the substrate subsequently leaves, internally of the substrate, residual charges that generate between the substrate and the electrostatic chuck an electrostatic attraction by which the dechucking force is determined.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. Like reference numerals refer to like elements throughout the specification.

It will also be understood that when elements or layers are referred to as being present "on" another element or layer, they can be placed on the other element or layer directly as well as through another intervening layer or element. In contrast, elements or layers, which are referred to as being present "directly on" or "immediately on" another element or layer, are supposed to involve no intervening layer or element between the other element or layer. It will be understood that, although the terms first, second, etc. may be used herein to describe various elements, components, and/or or sections, these elements, components, and/or sections should not be limited by these terms. These terms are only used to distinguish one element, component, or section from another element, component, or section. Thus, a first element, first component, or first section discussed below could be termed a second element, second component, or second section without departing from the teachings of the present disclosure.

Terms used in the present specification, which are intended to convey the illustrative embodiments, should not be interpreted as limiting the present disclosure. As used herein, the singular forms "a", "an" and "the" are intended to include the plural forms as well, unless the context clearly indicates otherwise. It will be further understood that the terms "comprises" and/or "comprising" and the variations thereof as used herein specify the presence of the stated component, step, operation, and/or element, but do not preclude the presence or addition of one or more of other components, steps, operations, and/or elements.

The present disclosure relates to a substrate testing apparatus capable of measuring a dechucking force of a substrate through a normal-force measuring unit capable of pushing or pulling the substrate in a vertical direction, a substrate testing apparatus, and a dechucking force evaluation method. Hereinafter, the present disclosure will be described in detail with reference to drawings and other illustrative examples.

Figure 1:
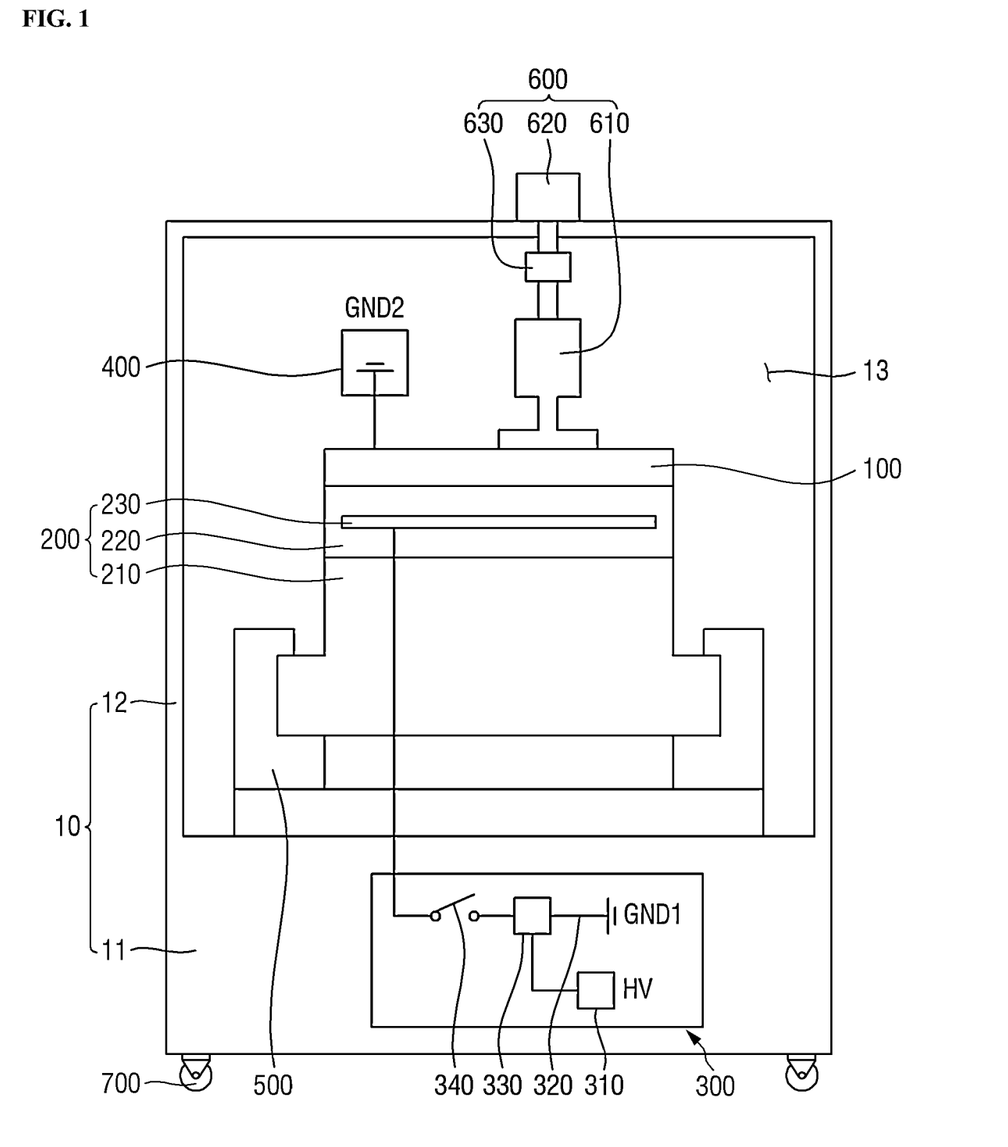
FIG. 1 is a cross-sectional view for explaining a substrate test apparatus according to at least one embodiment of the present disclosure.

FIG. 1 is a cross-sectional view for explaining a substrate test apparatus according to at least one embodiment of the present disclosure.

Referring to FIG. 1, the substrate testing apparatus according to some embodiments may include a test chamber 10, a substrate 100, a substrate support unit 200, an electrostatic-chuck power supplying unit 300, and a substrate power supplying unit 400, a clamp 500, and a driving unit 600. The substrate test apparatus may be an apparatus used for a test purpose for evaluating the dechucking force of the substrate 100.

The test chamber 10 may include an internal space 13 for processing the substrate 100. The test chamber 10 may further include a body section 11 and a frame section 12.

The body section 11 may support the components of the substrate test apparatus. In particular, the body section 11 may support the substrate 100, the substrate support 200, and the clamp 500. The body section 11 may be disposed under the substrate 100, the substrate support 200, and the clamp 500.

The frame section 12 may be formed from the upper surface edge of the body section 11. The frame section 12 may be disposed on the body section 11. The frame section 12 may surround the inner space of the body section 11. The test chamber 10 may secure an internal space 13 through the frame section 12.

Disposed in the internal space 13 of the test chamber 10 may be the substrate 100, substrate support unit 200, electrostatic-chuck power supplying unit 300, substrate power supplying unit 400, clamp 500, and driving unit 600. However, this is merely exemplary, and the technical idea of the present disclosure is not limited thereto.

The substrate test apparatus according to some embodiments may further include at least one or more transport units 700. The transport unit 700 may be disposed below the test chamber 10. The transport unit 700 may transport the test chamber 10.

The transport unit 700 is shown in the form of a wheel, but this is merely exemplary, and the technical idea of the present disclosure is not limited thereto.

The substrate support 200 may include a base 210, an electrostatic chuck 220, and an electrostatic chuck electrode 230. The electrostatic chuck 220 may be disposed on the base 210.

The electrostatic chuck 220 is adapted to support the substrate 100 seated thereon by using an electrostatic force.

The electrostatic chuck 220 may be made of ceramic material. The electrostatic chuck 220 may be fixedly joined with the base 210.

The base 210 may be disposed under the electrostatic chuck 220.

The base 210 may be shaped with a bottom portion wider in the horizontal direction. The base 210 may have a wider diameter at the bottom. As illustrated, the base 210 may have its bottom diameter wider than its upper portion to provide a handle for the clamp 500 to hold the base 210. Accordingly, the base 210 may be fixed by the clamp 500 as will be described below.

The electrostatic chuck electrode 230 may be provided in the electrostatic chuck 220. The electrostatic chuck electrode 230 receives a direct current (DC) voltage for chucking the substrate 100 and holds by suction the substrate with an electrostatic force. Thereafter, a dechucking process is performed for separating the substrate 100 from the electrostatic chuck 220.

The electrostatic-chuck power supplying unit 300 may apply a driving voltage HV and a first ground voltage GND1 to the electrostatic chuck 220. The electrostatic-chuck power supplying unit 300 may directly apply a voltage to the electrostatic chuck 220. However, this is merely exemplary, and the present disclosure is not limited thereto.

The electrostatic-chuck power supplying unit 300 may include a driving voltage application unit 310, a first ground voltage application unit 320, a control unit 330, and a switch 340.

The driving voltage applying unit 310 may apply driving voltage HV to the electrostatic chuck 220. The driving voltage applying unit 310 may use DC power. However, this is only an example, and the present disclosure is not limited thereto.

The first ground voltage applying unit 320 may apply the first ground voltage GND1 to the electrostatic chuck 220.

The controller 330 may be disposed between the driving voltage applying unit 310 and the first ground voltage applying unit 320. The controller 330 may determine which one between driving voltage HV and first ground voltage GND1 is to be applied to the electrostatic chuck 220.

Additionally, the electrostatic-chuck power supplying unit 300 may stop applying a voltage through the switch 340. For example, stopping the voltage application may be done by opening the switch 340 installed in the power line to which the voltage is applied.

The substrate power supplying unit 400 may apply a second ground voltage GND2 to the substrate 100. The substrate power supplying unit 400 may directly apply a voltage to the substrate 100. However, this is merely exemplary, and the present disclosure is not limited thereto.

In the drawings, the substrate power supplying unit 400 and the electrostatic-chuck power supplying unit 300 are illustrated as using different ground voltage sources, but this is merely exemplary, and the present disclosure is not limited thereto. For example, second ground voltage GND2 applied by the substrate power supplying unit 400 may be implemented by using the same source as the first ground voltage GND1 applied by the electrostatic-chuck power supplying unit 300.

The clamp 500 may be disposed on the upper surface of the body section 11. The clamp 500 may be disposed peripherally of the upper surface of the body section 11. A pair of clamp jaws may be formed into the clamp 500 on the body section 11. However, this is merely exemplary, and the present disclosure is not limited thereto.

The clamp 500 may be disposed below the electrostatic chuck 220. The clamp 500 may be disposed laterally of the substrate support 200. The clamp 500 may hold the substrate support 200 in place. Specifically, the clamp 500 may fix the electrostatic chuck 220.

For example, the clamp 500 may be integrally formed while surrounding the base 210.

The clamp 500 may have a hook shape. Accordingly, the clamp 500 may fix the base 210 of the substrate support 200 disposed thereon.

The shape of the clamp 500 is merely exemplary, and the present disclosure is not limited thereto. The clamp 500 may be shaped for fixing the electrostatic chuck 220 disposed thereon.

The clamp 500 may release the electrostatic chuck 220 for allowing the substrate test apparatus according to some embodiments to swap the electrostatic chuck 220 with another one.

As shown, a plate may be formed between the clamp 500 and the body section 11. This is only an example for stability of the substrate test apparatus, and the present disclosure is not limited thereto.

For example, the clamp 500 may be formed on the body section 11. The clamp 500 may be in contact with the body section 11.

The driving unit 600 may be disposed on the electrostatic chuck 220. Specifically, the driving unit 600 may be disposed on the substrate 100. The driving unit 600 may include a normal-force measuring unit 610, a motor 620, and a damper 630.

The normal-force measuring unit 610 may be disposed on the electrostatic chuck 220. Specifically, the normal-force measuring unit 610 may be disposed on the substrate 100. The normal-force measuring unit 610 may be in contact with the substrate 100.

Various devices may be employed for the normal-force measuring unit 610, such as a push-pull gauge and a load cell. However, this is merely exemplary, and the present disclosure is not limited thereto. The normal-force measuring unit 610 may be configured to measure the force in the vertical direction of the substrate 100 in measuring the electrostatic attraction of the substrate 100 by pulling thereof.

However, the method of measuring the force in the vertical direction of the substrate 100 by the normal-force measuring unit 610 does not limit the technical idea of the present disclosure. For example, when a load cell is employed as the normal-force measuring unit 610, the normal force may be measured by an amount that the load cell deforms by receiving a weight. This will obviate the need for the motor unit 620 to provide a driving force to the normal-force measuring unit 610. In the present disclosure, for convenience of description, the normal-force measuring unit 610 refers to a push-pull gauge.

The normal-force measuring unit 610 may push or pull the substrate 100 in a vertical direction.

The normal-force measuring unit 610 may be used after it is adhered to the substrate 100 to measure the dechucking force by pulling the substrate 100 in a vertical direction. A specific method of measuring the dechucking force will be described below. For example, the method of measuring dechucking force of a substrate test apparatus including placing a substrate on an electrostatic chuck, charging the substrate by applying a driving voltage to the electrostatic chuck and applying a second ground voltage to the substrate, subsequently discharging the substrate by applying a first ground voltage to the electrostatic chuck and by applying the second ground voltage to the substrate, and subsequently measuring a dechucking force of the substrate by pulling the substrate in a vertical direction by a normal-force measuring unit that is disposed on the substrate. The method may further step including, before the charging of the substrate, setting an initial charge of the substrate by applying the second ground voltage to the substrate. In this case, wherein when setting the initial charge of the substrate, keeping from applying the driving voltage and the first ground voltage to the electrostatic chuck. The method may further step including, after the charging of the substrate and before the discharging of the substrate, maintaining the substrate in a charged state by keeping from applying the driving voltage to the electrostatic chuck and by keeping from applying the second ground voltage to the substrate. In the above-mentioned method, wherein the measuring of the dechucking force of the substrate by pulling the substrate in a vertical direction by the normal-force measuring unit is performed by keeping from applying the second ground voltage to the substrate and by keeping from applying the driving voltage and the first ground voltage to the electrostatic chuck. In the above-mentioned method, wherein the discharging of the substrate subsequently leaves, internally of the substrate, residual charges that generate between the substrate and the electrostatic chuck an electrostatic attraction by which the dechucking force is determined.

The motor 620 may be disposed on the normal-force measuring unit 610. The motor 620 may be disposed on an outer wall of the test chamber 10. The motor 620 may be disposed on the upper surface of the test chamber 10. However, this is only an example in the drawings, and the present disclosure is not limited thereto.

For example, the motor 620 may well be disposed in the inner space 13 of the test chamber 10.

The motor 620 may provide the normal-force measuring unit 610 with a driving force for pushing or pulling the substrate 100. The motor 620 may provide the normal-force measuring unit 610 with a driving force in a direction perpendicular to the substrate 100. The motor 620 may provide a driving force to the normal-force measuring unit 610 through, for example, a ball screw mechanism. However, the power transmission method of the motor 620 is merely exemplary, and the present disclosure is not limited thereto.

The damper 630 may be disposed between the vertical force measurement unit 610 and the motor 620. The damper 630 may dampen the vibration generated while the motor 620 provides the driving force to the normal-force measuring unit 610.

Figure 2:
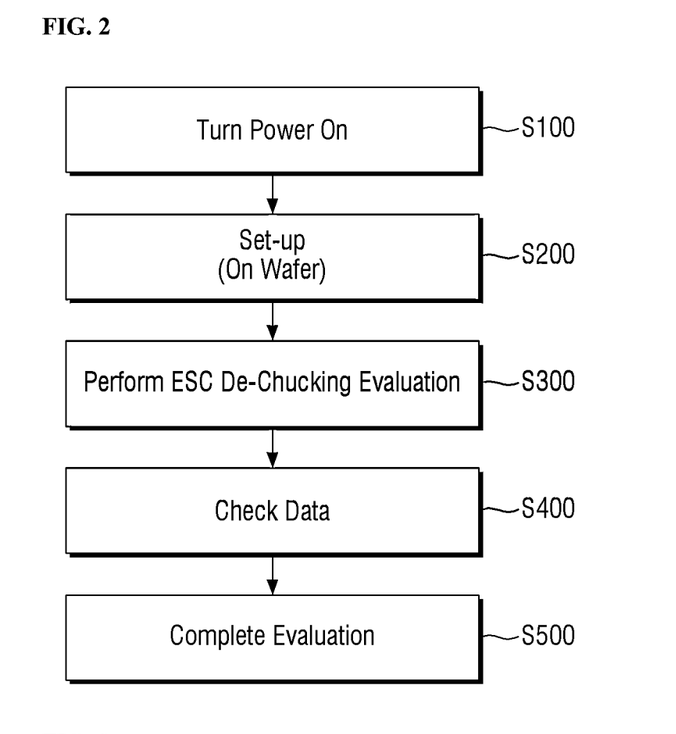
FIGS. 2 and 3 are flowcharts for explaining a dechucking force evaluation method according to at least one embodiment of the present disclosure.
Figure 3:
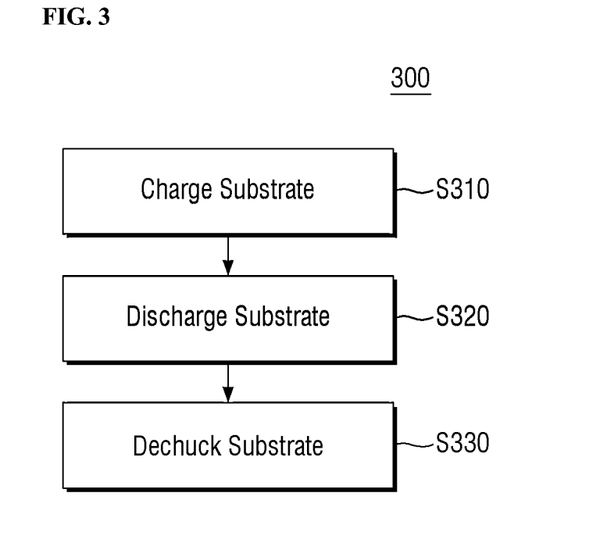
Figure 6:
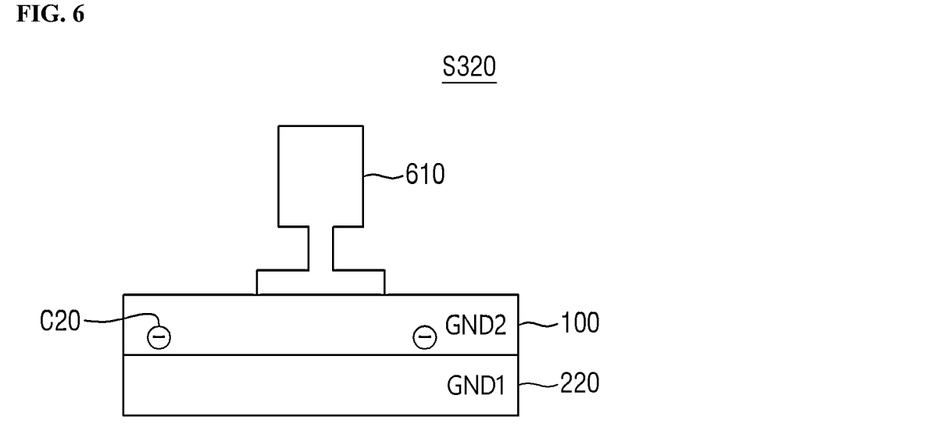
Figure 7:
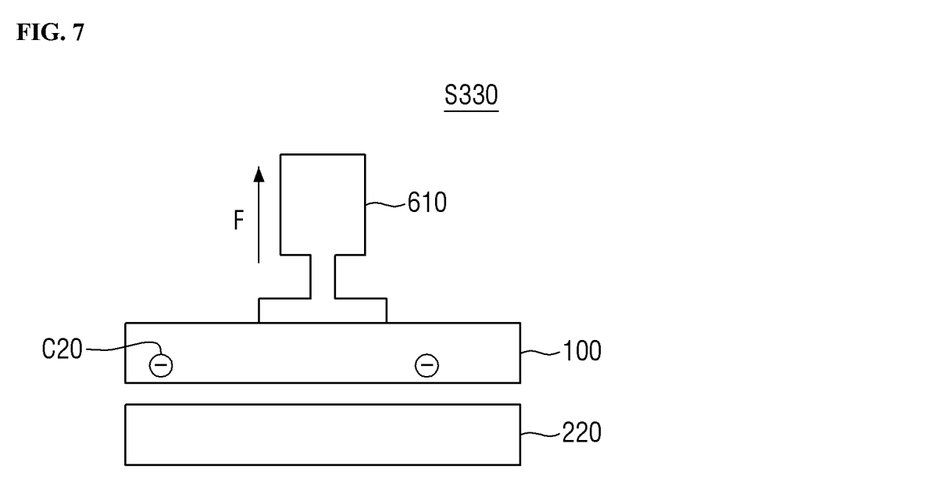
Figure 8:
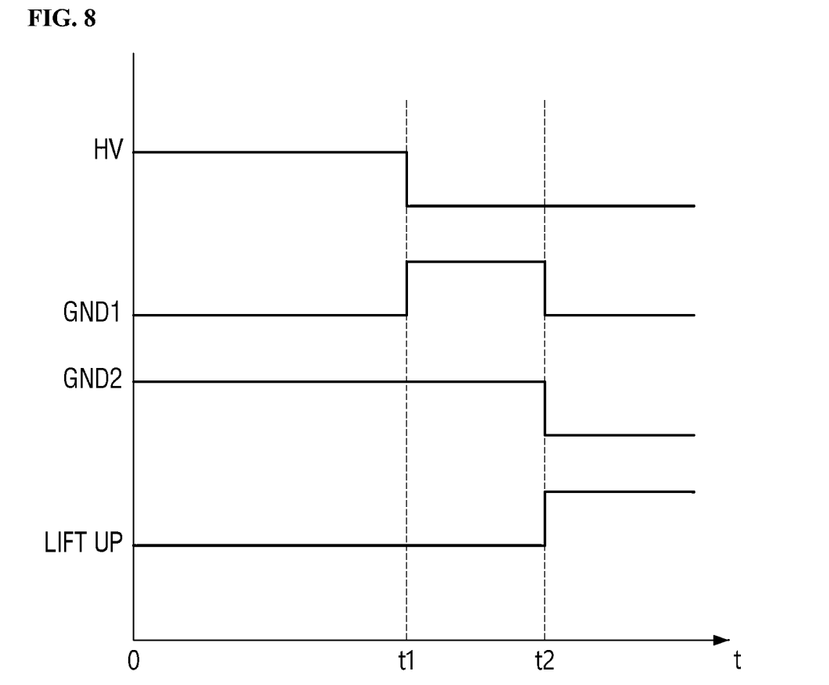
FIG. 8 is a graph for explaining voltage applications and wafer lifting in intermediate steps of the dechucking force evaluation method according to FIG. 3.
Figure 9:
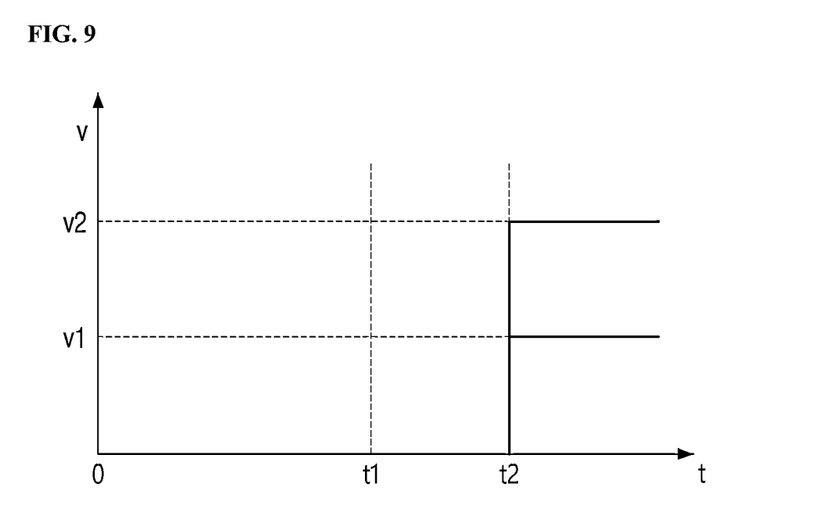
FIG. 9 is a graph for explaining the speed at which a normal-force measuring unit pulls a substrate in the intermediate steps of the dechucking force evaluation method according to FIG. 3.

FIGS. 2 and 3 are flowcharts for explaining a dechucking force evaluation method according to at least one embodiment of the present disclosure. FIGS. 4 to 7 are diagrams of intermediate steps for explaining a dechucking force evaluation method according to at least one embodiment of the present disclosure. FIG. 8 is a graph for explaining a voltage application state and a lifting state of a wafer in intermediate steps of the dechucking force evaluation method according to FIG. 3. FIG. 9 is a graph for explaining the speed at which the normal-force measuring unit 610 pulls the substrate 100 in the intermediate steps of the dechucking force evaluation method according to FIG. 3.

For reference, FIGS. 2 and 3 show a sequence of a dechucking force evaluation method using a substrate test apparatus according to some embodiments.

Referring to FIG. 2, Step S100 may turn on the substrate test apparatus. The substrate test device is an electronic device that evaluates the dechucking force by providing voltage and driving force, so an electric power supply may be required.

Next, an initial set-up may be performed with respect to the substrate 100 (S200). The initial set-up may mean evaluating an initial position, an initial voltage, etc. to evaluate a dechucking force for the substrate 100.

As an example, the substrate 100 may be positioned on the electrostatic chuck 220. The substrate 100 may be disposed between the electrostatic chuck 220 and the normal-force measuring unit 610.

Figure 4:
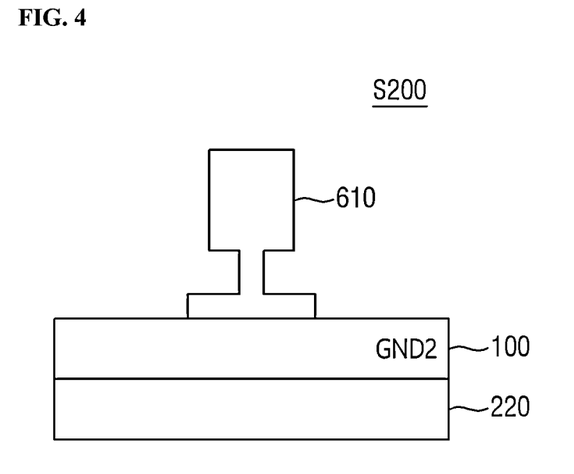
FIGS. 4 to 7 are diagrams of intermediate steps of a dechucking force evaluation method according to at least one embodiment of the present disclosure.

As another example, referring to FIGS. 2 and 4, second ground voltage GND2 may be applied to the substrate 100. The application of second ground voltage GND2 to the substrate 100 may be to remove residual charges remaining in the substrate 100. Accordingly, before charging the substrate 100, the initial charge of the substrate 100 may be set.

When setting the initial charge of the substrate 100, the electrostatic-chuck power supplying unit 300 may not apply the driving voltage HV and first ground voltage GND1 to the electrostatic chuck 220.

Referring to FIGS. 2, 3, and 5 to 7, after the initial set-up of the substrate 100, the substrate test apparatus may perform the dechucking evaluation of the electrostatic chuck 220 (S300).

Figure 5:
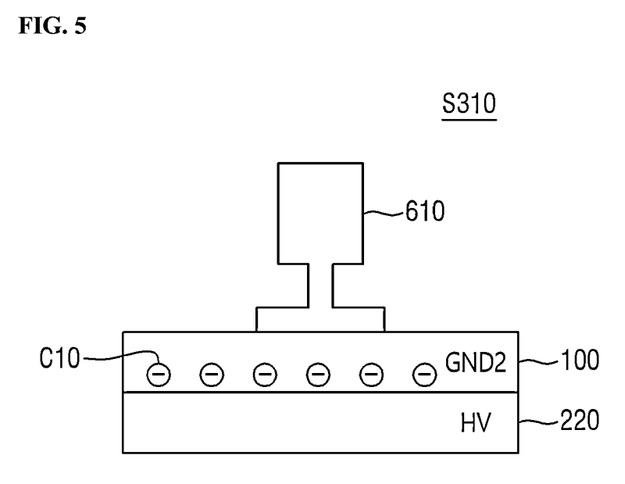

First, the substrate 100 may be charged (S310). To charge the substrate 100, a driving voltage HV may be applied to the electrostatic chuck 220. A second ground voltage GND2 may be applied to the substrate 100.

The driving voltage HV to the electrostatic chuck 220 may be about 2.73 kV. As the driving voltage HV is applied to the electrostatic chuck 220, the substrate 100 may be charged. First residual charges C10 may be collected toward the lower surface of the substrate 100 adjacent to the electrostatic chuck 220.

Charging the substrate 100 (S310) may simulate a process of chucking the substrate 100 on the electrostatic chuck 220 as carried out in a semiconductor processing process.

Second, the substrate 100 may be discharged (S320). To discharge the substrate 100, first ground voltage GND1 may be applied to the electrostatic chuck 220. Second ground voltage GND2 may be applied to the substrate 100.

As the first ground voltage GND1 is applied to the electrostatic chuck 220, the substrate 100 may be discharged. Specifically, the first residual charges C10, which are collected on the lower surface of the substrate 100 adjacent to the electrostatic chuck 220, may be dispersed. Accordingly, on the lower surface of the substrate 100, an amount of second residual charges C20 may be collected, which is smaller than first residual charges C10 that keep the substrate 100 in the charged state.

Discharging the substrate 100 (S320) may simulate a process of discharging the substrate 100 as carried out in the semiconductor processing process to dechuck the substrate 100 from the electrostatic chuck 220.

Third, the substrate 100 may be dechucked (S330). To dechuck the substrate 100, driving voltage HV and first ground voltage GND1 may be kept from being applied to the electrostatic chuck 220. Second ground voltage GND2 may be kept from being applied to the substrate 100.

Thereafter, the normal-force measuring unit 610 may pull the substrate 100 in a vertical direction. Accordingly, the substrate 100 may be dechucked to be spaced apart from the electrostatic chuck 220.

After the substrate 100 is discharged, the second residual charge C20 may remain inside the substrate 100. The second residual charge C20 may cause an electrostatic attraction to be generated between the substrate 100 and the electrostatic chuck 220. With no voltage applied to the electrostatic chuck 220 and the substrate 100, an electrostatic attraction may stay with the electrostatic chuck 220 due to the second residual charge C20 remaining in the substrate 100.

At this time, the normal-force measuring unit 610 may pull the substrate 100 and thereby measure the electrostatic attraction. The electrostatic attraction may correspond to a dechucking force F. In other words, dechucking force F may be determined by the electrostatic attraction.

Referring to FIGS. 3 and 8, Step S310 of charging the substrate 100 may proceed until a first time t1.

For reference, the horizontal axis in FIG. 8 is an axis for describing time. The vertical axis indicates whether driving voltage HV and first ground voltage GND1 are applied to the electrostatic chuck 220, whether second ground voltage GND2 is applied to the substrate 100, and whether the normal-force measuring unit 610 pulls or lifts up the substrate 100.

Up to the first time t1, driving voltage HV is applied to the electrostatic chuck 220. First ground voltage GND1 is not applied to the electrostatic chuck 220. Second ground voltage GND2 is applied to the substrate 100.

The discharging of the substrate 100 (S320) may proceed from the first time t1 to a second time t2.

Driving voltage HV is not applied to the electrostatic chuck 220 from first time t1 to second time t2. First ground voltage GND1 is applied to the electrostatic chuck 220. Second ground voltage GND2 is applied to the substrate 100.

The time taken for the substrate 100 to be charged until the first time t1 may be referred to as a first operating time 0 to t1. The time taken for the substrate 100 to be charged from the first time t1 to the second time t2 may be referred to as a second operating time t1 to t2. The first operating time 0 to t1 may be different from the second operating time t1 to t2. Specifically, the first operating time 0 to t1 may be longer than the second operating time t1 to t2.

After discharging the substrate 100, from the second time t2, the substrate 100 may be lifted by the normal-force measuring unit 610. At this time, the driving voltage HV is not applied to the electrostatic chuck 220. First ground voltage GND1 is not applied to the electrostatic chuck 220. Second ground voltage GND2 is not applied to the substrate 100.

Referring to FIGS. 3 and 9, Step S330 of dechucking the substrate 100 may be performed after the second time t2.

For reference, in FIG. 9, the horizontal axis is an axis for describing time, and the vertical axis is an axis for describing speed. Additionally, FIG. 9 is a graph for explaining various speeds of the normal-force measuring unit 610 when lifting up the substrate 100.

Upon receiving a driving force from the motor 620, the normal-force measuring unit 610 can constantly pull the substrate 100 at a first speed v1 or a second speed v2. First speed v1 may be different from second speed v2.

For example, first speed v1 may be lower than second speed v2.

Although the normal-force measuring unit 610 has been described as lifting or pulling the substrate 100 at two speeds, which is merely exemplary, the present disclosure is not limited thereto. For example, the normal-force measuring unit 610 may constantly pull the substrate 100 at two or more speeds.

After the dechucking evaluation of the electrostatic chuck 220 is performed (S300), the measured dechucking force F is checked (S400).

The higher dechucking force F is measured, the larger amount of electrostatic attraction remains between the substrate 100 and the electrostatic chuck 220. It may mean that dechucking of the substrate 100 is incompletely performed due to a large amount of charge remaining on the substrate 100.

The evaluation of the dechucking force is then completed (S500).

Figure 10:
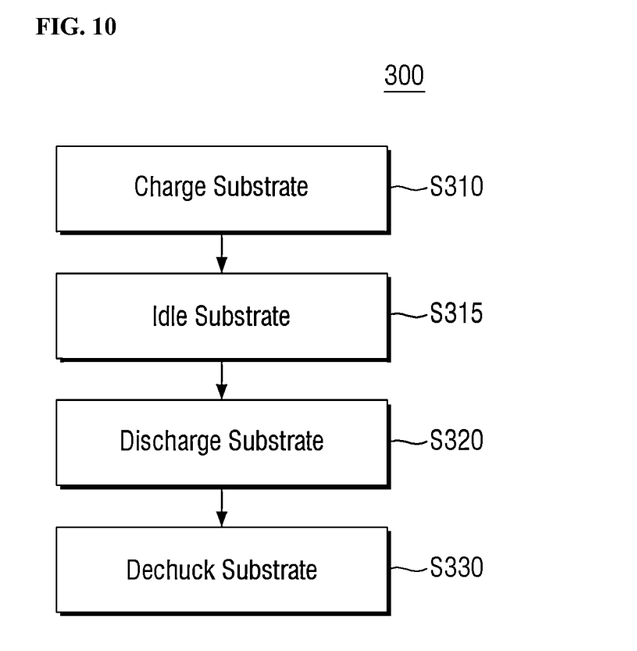
FIG. 10 is a flowchart of a dechucking force evaluation method according to at least one embodiment of the present disclosure.
Figure 11:
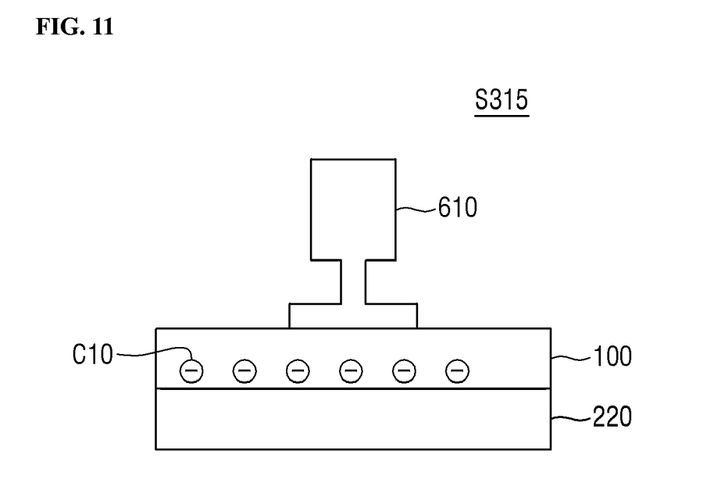
FIG. 11 is a diagram of an intermediate step for explaining a dechucking force evaluation method according to at least one embodiment of the present disclosure.
Figure 12:
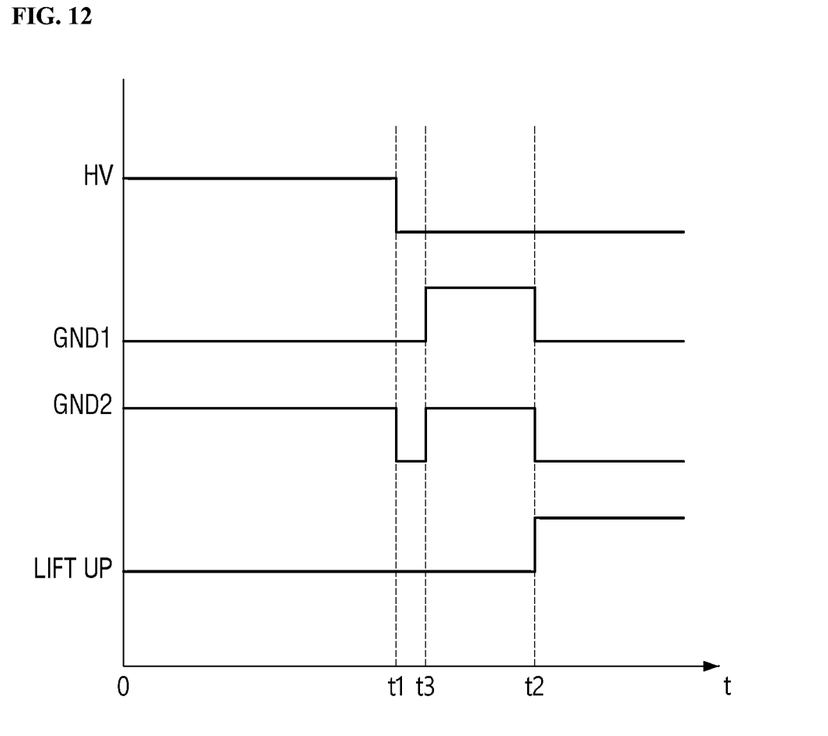
FIG. 12 is a graph for explaining voltage applications and wafer lifting in intermediate steps of the dechucking force evaluation method according to FIG. 10.

FIG. 10 is a flowchart of a dechucking force evaluation method according to at least one embodiment of the present disclosure. FIG. 11 is an intermediate step diagram for explaining a dechucking force evaluation method according to at least one embodiment of the present disclosure. FIG. 12 is a graph for explaining voltage applications and wafer lifting in intermediate steps of the dechucking force evaluation method according to FIG. 10. For the convenience of description, redundant descriptions of those described with reference to FIGS. 2 to 8 will be simplified or omitted.

For reference, FIG. 10 illustrates a detailed sequence of Step S300 in a dechucking force evaluation method using a substrate test apparatus according to some embodiments.

Referring to FIGS. 10 and 11, the dechucking force evaluation method may further include, after charging the substrate 100 (S310) and before discharging the substrate 100 (S320), Step S315 of idling the substrate 100.

While idling the substrate 100 (S315), driving voltage HV and first ground voltage GND1 may not be applied to the electrostatic chuck 220. Second ground voltage GND2 may not be applied to the substrate 100.

With no voltage applied to the electrostatic chuck 220 and the substrate 100, the substrate 100 may be maintained in a charged state. Therefore, first residual charges C10 may remain collected on the lower surface of the substrate 100 adjacent to the electrostatic chuck 220.

The idling of the substrate 100 (S315) may definitely distinguish between the charging of the substrate 100 (S310) and the discharging of the substrate 100 (S320) to well define the proceeding of the steps.

Referring to FIG. 12, between the step of charging the substrate 100 and the step of discharging the substrate 100, the step of idling the substrate 100 may be included.

The step of idling for the substrate 100 may proceed from the first time t1 to the third time t3 after the substrate 100 is charged.

The driving voltage HV and the first ground voltage GND1 are not applied to the electrostatic chuck 220 from first time t1 to third time t3. The second ground voltage GND2 is not applied to the substrate 100.

The discharging of the substrate 100 (S320) may proceed from the third time t3 to the second time t2.

The driving voltage HV is not applied to the electrostatic chuck 220 from the third time t3 to the second time t2. First ground voltage GND1 is applied to the electrostatic chuck 220. Second ground voltage GND2 is applied to the substrate 100.

The time taken for the substrate 100 to be charged until the first time t1 may be defined as the first operating time 0 to t1. The time taken for the substrate 100 to be discharged from third time t3 to second time t2 may be defined as the second operating time t3 to t2. The first operating time 0 to t1 may be different from the second operating time t3 to t2. Specifically, the first operating time 0 to t1 may be longer than the second operating time t3 to t2.

The time taken from the first time t1 to the third time t3 for maintaining the substrate 100 in a charged state may be defined as the third operating time t1 to t3. The third operating time t1 to t3 may be shorter than the first operating time 0 to t1 and the second operating time t3 to t2.

While some embodiments of the present disclosure have been particularly shown and described with reference to the accompanying drawings, it will be understood by those of ordinary skill in the art that various changes in form and details may be made therein without departing from the technical idea and scope of the present disclosure as defined by the following claims.

The invention claimed is:

1. A substrate test apparatus, comprising:
an electrostatic chuck configured to support a substrate;
a normal-force measuring unit disposed on the electrostatic chuck;
an electrostatic-chuck power supplying unit configured to apply a driving voltage and a first ground voltage to the electrostatic chuck; and
a substrate power supplying unit configured to apply a second ground voltage to the substrate,
wherein the substrate test apparatus is configured to perform steps comprising:
applying the driving voltage to the electrostatic chuck, and charging the substrate by applying the second ground voltage to the substrate;
subsequently discharging the substrate by applying the first ground voltage to the electrostatic chuck and by applying the second ground voltage to the substrate; and
subsequently measuring a dechucking force of the substrate by the normal-force measuring unit.

2. The substrate test apparatus of claim 1, configured to perform a further step comprising:
before the charging of the substrate, setting an initial charge of the substrate by applying the second ground voltage to the substrate.

3. The substrate test apparatus of claim 2, wherein the electrostatic-chuck power supplying unit is responsive to the setting of the initial charge of the substrate for keeping from applying the driving voltage and the first ground voltage to the electrostatic chuck.

4. The substrate test apparatus of claim 1, wherein the charging of the substrate proceeds during a first operating time, and the discharging of the substrate proceeds during a second operating time different from the first operating time.

5. The substrate test apparatus of claim 1, configured to perform a further step comprising:
after the charging of the substrate and before the discharging of the substrate, maintaining the substrate in a charged state by keeping from applying the driving voltage to the electrostatic chuck and by keeping from applying the second ground voltage to the substrate.

6. The substrate test apparatus of claim 5, wherein the charging of the substrate proceeds during a first operating time, the discharging of the substrate proceeds during a second operating time shorter than the first operating time, and the maintaining of the substrate in a charged state proceeds during a third operating time shorter than the second operating time.

7. The substrate test apparatus of claim 1, further comprising:
a clamp disposed under the electrostatic chuck and configured to hold the electrostatic chuck in place.

8. The substrate test apparatus of claim 1, wherein the measuring of the dechucking force of the substrate by the normal-force measuring unit is performed while keeping from applying the second ground voltage to the substrate and keeping from applying the driving voltage and the first ground voltage to the electrostatic chuck.

9. The substrate test apparatus of claim 1, wherein the discharging of the substrate subsequently leaves, internally of the substrate, residual charges that generate between the substrate and the electrostatic chuck an electrostatic attraction by which the dechucking force is determined.

10. The substrate test apparatus of claim 1, further comprising:
a test chamber including an interior space configured to process the substrate; and
a transport unit disposed under the test chamber and configured to transport the test chamber.

11. The substrate test apparatus of claim 10, further comprising:
a motor disposed on an upper surface of the test chamber and configured to provide the normal-force measuring unit with a driving force capable of pushing or pulling the substrate, the motor providing the normal-force measuring unit with the driving force through a ball screw mechanism in a direction perpendicular to the substrate.

12. The substrate test apparatus of claim 11, wherein upon receiving the driving force from the motor, the normal-force measuring unit is actuated to constantly pull the substrate at a first speed or a second speed that is different from the first speed.

13. The substrate test apparatus of claim 11, further comprising:
a damper disposed between the motor and the normal-force measuring unit and configured to reduce a vibration generated when the motor provides the driving force to the normal-force measuring unit.

14. A method of measuring dechucking force, comprising:
placing a substrate on an electrostatic chuck;
charging the substrate by applying a driving voltage to the electrostatic chuck and applying a second ground voltage to the substrate;
subsequently discharging the substrate by applying a first ground voltage to the electrostatic chuck and by applying the second ground voltage to the substrate; and
subsequently measuring a dechucking force of the substrate by pulling the substrate in a vertical direction by a normal-force measuring unit that is disposed on the substrate.

15. The method of claim 14, further step comprising:
before the charging of the substrate, setting an initial charge of the substrate by applying the second ground voltage to the substrate.

16. The method of claim 15, wherein when setting the initial charge of the substrate, keeping from applying the driving voltage and the first ground voltage to the electrostatic chuck.

17. The method of claim 14, further comprising:
after the charging of the substrate and before the discharging of the substrate, maintaining the substrate in a charged state by keeping from applying the driving voltage to the electrostatic chuck and by keeping from applying the second ground voltage to the substrate.

18. The method of claim 14, wherein the measuring of the dechucking force of the substrate by pulling the substrate in a vertical direction by the normal-force measuring unit is performed by keeping from applying the second ground voltage to the substrate and by keeping from applying the driving voltage and the first ground voltage to the electrostatic chuck.

19. The method of claim 14, wherein the discharging of the substrate subsequently leaves, internally of the substrate, residual charges that generate between the substrate and the electrostatic chuck an electrostatic attraction by which the dechucking force is determined.

20. A substrate test apparatus, comprising:
an electrostatic chuck configured to support a substrate;
a normal-force measuring unit disposed on the electrostatic chuck;
an electrostatic-chuck power supplying unit configured to apply a driving voltage and a first ground voltage to the electrostatic chuck; and
a substrate power supplying unit configured to apply a second ground voltage to the substrate,
wherein the substrate test apparatus is configured to perform steps comprising:
applying the driving voltage to the electrostatic chuck, and charging the substrate by applying the second ground voltage to the substrate;
subsequently discharging the substrate by applying the first ground voltage to the electrostatic chuck and by applying the second ground voltage to the substrate; and
subsequently measuring a dechucking force of the substrate by the normal-force measuring unit,
wherein the charging of the substrate proceeds during a first operating time, and the discharging of the substrate proceeds during a second operating time different from the first operating time, and
wherein the measuring of the dechucking force of the substrate by the normal-force measuring unit is performed while keeping from applying the second ground voltage to the substrate and keeping from applying the driving voltage and the first ground voltage to the electrostatic chuck.

* * * * *